United States Patent
Sato et al.

[11] Patent Number: 5,916,382
[45] Date of Patent: Jun. 29, 1999

[54] HIGH CORROSION RESISTANT HIGH STRENGTH SUPERALLOY AND GAS TURBINE UTILIZING THE ALLOY

[75] Inventors: Koji Sato; Takehiro Ohno, both of Yasugi; Ken Yasuda; Hideki Tamaki, both of Hitachi; Akira Yoshinari, Katsuta, all of Japan

[73] Assignees: Hitachi, Ltd.; Hitachi Metals, Ltd., both of Tokyo, Japan

[21] Appl. No.: 08/331,155

[22] Filed: Oct. 28, 1994

Related U.S. Application Data

[63] Continuation of application No. 08/028,216, Mar. 9, 1993.

[30] Foreign Application Priority Data

Mar. 9, 1992 [JP] Japan .................................... 4-050426

[51] Int. Cl.$^6$ ..................................................... C22C 19/05
[52] U.S. Cl. ......................... 148/404; 148/410; 148/428; 420/445; 420/448
[58] Field of Search .................................. 420/445, 448, 420/588; 148/404, 410, 419, 428, 442

[56] References Cited

U.S. PATENT DOCUMENTS

| | | | |
|---|---|---|---|
| 4,116,723 | 9/1978 | Gell et al. | 148/410 |
| 4,388,124 | 6/1983 | Henry | 148/428 |
| 4,719,080 | 1/1988 | Duhl et al. | 148/404 |
| 4,764,225 | 8/1988 | Shankar et al. | |
| 4,878,965 | 11/1989 | Gostic et al. | 148/404 |
| 5,077,141 | 12/1991 | Naik et al. | 148/410 |
| 5,489,194 | 2/1996 | Yoshinara et al. | 416/241 R |

FOREIGN PATENT DOCUMENTS

| | | |
|---|---|---|
| 0 155 827 | 1/1989 | European Pat. Off. . |
| 0 297 785 | 1/1989 | European Pat. Off. . |
| 59-34776 | 8/1984 | Japan . |
| 60-211031 | 10/1985 | Japan . |
| 02-138431 | 5/1990 | Japan . |
| 04124237 | 4/1992 | Japan . |
| 2159174 | 11/1985 | United Kingdom ................... 420/445 |

*Primary Examiner*—George Wyszomierski
*Attorney, Agent, or Firm*—Antonelli, Terry, Stout & Kraus, LLP

[57] ABSTRACT

A superalloy having more excellent hot corrosion resistance than conventional single crystal alloys, oxidation resistance levels as high as that of conventional single crystal alloys, high strength, and creep rupture strength; single crystal members used for a blade or a nozzle produced by utilizing such an alloy; and a combined cycle power generation system produced by utilizing such members. A highly hot corrosion resistant and high-strength superalloy consisting essentially of, by weight, 6–12% Cr, 4.5–6.5% Al, 2–12% W, 2.5–10% Ta, not more than 5.8% Mo, 0.1–3% Co, 0.2–3% Nb, 0.1–4% Re, not more than 0.3% Hf, and the balance being Ni and unavoidable impurities; single crystal members used for a blade or a nozzle produced utilizing such an alloy; and a combined cycle power generation system produced by utilizing such members.

11 Claims, 8 Drawing Sheets

HIGH CORROSION RESISTANT HIGH STRENGTH SUPERALLOY AND GAS TURBINE UTILIZING THE ALLOY

This application is a continuation application of Ser. No. 08/028,216, filed Mar. 9, 1993.

BACKGROUND OF THE INVENTION

1. Field of the Invention

The present invention relates to a novel superalloy used for blades (or buckets) and nozzles (vanes) of a gas turbine for aircraft or for land base which requires high creep rupture strength in the combustion gas atmosphere at a high temperature, a single crystal casting produced by utilizing such a superalloy, single crystal structure members for a gas turbine produced by utilizing such a casting having single crystal structure, and a high efficient gas turbine produced by utilizing such a single crystal structure member and, more particularly, for such uses with respect to land-based gas turbine which requires a material having high hot corrosion resistance. This invention also relates to a high efficient combined cycle power generation system produced by utilizing such a high efficient gas turbine.

2. Description of the Related Art

In response to the rise in the combustion temperature corresponding to high power and high efficiency of a gas turbine, the alloy used for a turbine blade which is exposed to the harshest use has been shifted from a conventional casting alloy having a polycrystal structure to an alloy having a directional columnar crystal structure which has no crystal grain boundary in the direction in which stress is applied, and further to a single crystal alloy which has no grain boundary whatsoever. Such a development has been mainly seen in a gas turbine for aircraft which has a rather short continuous operation time, and high creep rupture strength and high fatigue strength to low cyclic variation of load have been considered -to be important.

Alloy 444 (U.S. Pat. No. 4,116,723, JP-B2-59-34776), PWA 1484 (U.S. Pat. No. 4,719,080, JP-A-61-284545, "Second-generation Nickel-base Single Crystal Superalloy"; A. D. Cetel and D. N. Duhl; Superalloys 1988, The Metall. Soc., (1988), pp. 235–244), CMSX-4 (U.S. Pat. No. 4,643,782, JP-A-60-211031, "Process and Alloy Optimization for CMSX-4 Superalloy Single Crystal Airfoils"; D. J. Fraiser, J. R. Whetstone, K. Harris, G. L. Erickson, R. E. Schwer; High Temp. Mater. Power Eng. 1990 Part 2, (1990), pp. 1281–1300), and SC-83K (U.S. Pat. No. 4,976,791, JP-A-2138431, "Development of Nickel-base Single Crystal Superalloy"; Takehiro Ohno and Rikizo Watanabe; "Iron and Steel", vol. 77, (1991) pp. 832–839) have been developed used for the purpose of a blade of a gas turbine for aircraft, and they do not necessarily have sufficient high hot corrosion resistance.

At present, the members of a gas turbine, such as blades and nozzles, are protected from the harshly corrosive environment by spray coating with alloy having high corrosion resistance and also spray coating with ceramics on the surface of the members of a gas turbine in low pressure plasma atmosphere. However, the coating on the surface is occasionally peeled off, and it is desirable that the hot corrosion of the peeled-off portions be extremely delayed from progressing as low as possible. Since a gas turbine for aircraft has a short continuous operation time and a short inspection cycle, it can be still used even though it has a single crystal superalloy with insufficient corrosion resistance. Nevertheless, it is still desirable to reduce the maintenance work which results in improving reliability. Thus the improvement in hot corrosion resistance of a superalloy is in great demand.

On the other hand, a conventional casting alloy is usually used for blades of a gas turbine of land-base use because it is used at a lower temperature than that of a gas turbine for aircraft. However, due to the recent global environmental pollution issues, a high-efficient land-based gas turbine is rapidly coming into demand, and the combustion temperature of a gas turbine is rising even for land-base use. Accordingly, an alloy for the blade needs to shift from an ordinary casting alloy to a single crystal alloy. A gas turbine of land-base use has a much longer continuous operation time than that of aircraft, and accordingly, it has a long interval time between inspections. Therefore, it is particularly important to delay the progressing of hot corrosion when the coating of a blade of a gas turbine has peeled off. Thus, it is necessary to provide higher hot corrosion and oxidation resistance under the combustion gas atmosphere for a land-based gas turbine than for a gas turbine for aircraft. However, a single crystal alloy used for a gas turbine which possesses such high hot corrosion resistance has not yet been put to practical use.

Also, the most significant factor for facilitating efficiency of a gas turbine is to raise the temperature under which first stage blades and nozzles can endure. If a highly hot corrosion resistant and high-strength superalloy and a single crystal casting structure using such a superalloy which are able to solve the above-mentioned problem are produced, the combustion temperature of a gas turbine can be raised. As a result, the efficiency of a gas turbine is facilitated.

Furthermore, if such a high-efficiency gas turbine is produced, it is possible to obtain a high-efficient combined cycle power generation system having more than 50% of heat efficiency of the whole plant, which system cannot be obtained according to the related art, in a complex plant having an exhaust heat recovery boiler which obtains steam from the energy of the gas exhausted by such a gas turbine, a steam turbine driven by the steam, and a power generator driven by the gas turbine and the steam turbine.

Sodium chloride and sodium sulfate are generally known as corrosion reactants contained in the combustion gas of a gas turbine of land-base use. In general, corrosion resistance is evaluated by various tests using such salt mixture, such as a burner rig method, a coating and heating method, and a total immersion in molten salt method. In the case where a single crystal alloy used in a gas turbine of land-base use is employed, it is required to have hot corrosion resistance as substantially the same level, or close to the level of that of Rene 80 (60Ni-14Cr-9.5Co-4Mo-4W-3Al-5Ti-0.17C-0.015B-0.03Zr) which has been widely used as a conventional casting alloy. Moreover, in the case where a single crystal alloy is exposed under a higher temperature than Rene 80, it is also required to have even more excellent oxidation resistance than Rene 80.

The present inventors have compared corrosion resistance of various kinds of conventional alloys for single crystal casting and that of Rene 80 by employing a test in which the alloys are immersed totally in a molten salt as a means of evaluating their corrosion resistance, as shown in an example which will be described later. In this test, these alloys have been tested under polycrystal state. Among the above-mentioned single crystal alloys (Alloy 444 has not been evaluated since it does not have the strength at which the present invention aims.), PWA1484 and SC-83K are known as alloys having the highest creep rupture strength in the world. However, in the evaluation of the present experiment, a piece of these alloys being tested for hot corrosion resistance has been completely melted in the crucible. Thus, the present inventors have discovered that these alloys do not have sufficient hot corrosion resistance for blades of a land-based gas turbine.

On the other hand, the corrosion resistance of CMSX-4 having a lower high temperature strength than PWA1484 and SC-83K has completely fallen short of the hot corrosion resistance of Rene 80 though it is more excellent in hot corrosion resistance than conventional single crystal alloys.

SUMMARY OF THE INVENTION

Accordingly, an object of the present invention is to provide a superalloy having high hot corrosion resistance and high strength which alloy possesses corrosion and oxidation resistance as high as conventional casting alloys and creep rupture strength as strong as conventional single crystal alloys suited for single crystal members used for blades and nozzles of a land-based gas turbine or a gas turbine for aircraft whose blades are required to have high creep rupture strength under a high temperature combustion gas atmosphere. Another object of the present invention is to provide a casting having single crystal structure produced by utilizing such an alloy. A further object of the present invention is to provide a gas turbine blade and gas turbine nozzle produced by utilizing such a casting having single crystal structure. A still further object of the present invention is to provide a high efficient gas turbine produced by utilizing such a blade and a nozzle, and furthermore high-efficiency combined cycle power generation system which has more than 50% of the heat efficiency produced by utilizing such a gas turbine.

To achieve these objects, as a pre-examination to the development of a single crystal alloy, the present inventors have examined the effect of various kinds of additional alloying elements on the improvement of hot corrosion resistance of the alloy. The pre-examination has been done with polycrystal structure. First, among various types of conventionally developed single crystal alloys having high strength which are familiar in various literature, polycrystal alloys which have the identical chemical components as those of the alloys shown in literature have been produced. Further, the identical thermal treatment conditions as those of the alloys disclosed in literature have been carried out, and the hot corrosion and oxidation resistance of the alloys have been evaluated. The results of the examination are indicated as the specific values of conventional alloys in the example of the present invention.

Both CMSX-4 and PWA1484 which have been developed recently are alloys containing 3% rhenium which produces a positive effect on strength and hot corrosion resistance. In our examination, we have acknowledged that CMSX-4 is able to improve hot corrosion resistance better than alloys which do not contain Re, such as SC83K, but that CMSX-4 has still considerably less hot corrosion resistance than Rene 80.

On the other hand, we have discovered that PWA1484 has totally insufficient hot corrosion resistance as well as SC83K although it contains 3% rhenium as CMSX-4 does. This is due to a low percentage (5%) chromium contained in PWA1484. As is understood from the foregoing discovery, if the additive amount of chromium is reduced excessively with a view to improving the strength of an alloy, such an alloy is to fall totally short of the level of hot corrosion resistance at which the present invention aims.

According to the foregoing description, the hot corrosion and oxidation resistance in the combustion gas atmosphere is strongly required for the members of a gas turbine of land-base use, such as blades. The present inventors have paid their attention to a strengthening element of γ'-phase, niobium, which is homologous as tantalum which has been rather underestimated in terms of strength in the development of single crystal alloys, and they have evaluated hot corrosion resistance of alloys. As a result, though the hot corrosion mechanism has not been clearly explained at present, in the case where an appropriate amount of niobium is added together with rhenium to an alloy, it is clearly seen that hot corrosion resistance of such an alloy is far higher than that of conventional single crystal alloys, and that hot corrosion resistance as good as Rene 80, which is an conventional casting alloy having high hot corrosion resistance, or close thereto can be obtained.

Furthermore, in a comparative test of a sample of an alloy which has been single-crystallized according to the present invention and Rene 80, a simulation combustion test in which combustion in an actual apparatus is simulated has been carried out, and an alloy of the present invention has shown to have even more excellent hot corrosion resistance than Rene 80. One of the characteristics of the present invention is that the effect of addition of niobium and the effect of complex addition of niobium and rhenium have been clearly disclosed. Such a characteristic cannot be seen in the related art. Niobium belongs to the same group as tantalum, which serves as a γ'-phase strengthening element and contributes to improving creep-rupture strength at high temperature like as tantalum. Tantalum is excellent as compared with niobium in the above effects. There is a most suitable proportion of the amount of tantalum and niobium with respect to strength and corrosion resistance of the alloy. Also, another characteristic of the present invention is that an optimal additive amount of cobalt has been discovered. Cobalt has been regarded merely as impurities, or conversely approximately between 5 and 10% cobalt have been added with a view to improving the strength in conventional alloys. It has been disclosed that excessive cobalt is inappropriate in terms of hot corrosion and oxidation resistance and strength for an alloy of the present invention. Such cobalt whose amount has been controlled carefully, together with a small amount of hafnium has produced a remarkable impact on improving both hot corrosion and oxidation resistance and the high temperature strength of an alloy according to the present invention.

Tungsten and tantalum contribute to improving high temperature strength. However, in the case where a large amount of both elements are added to an alloy, α-tungsten phase and undissolved eutectic γ'-phase are left, which undesirably cause a reduction in the high temperature strength and an increase in the specific gravity of the alloy even though the strength of the alloy is improved. In order to solve this problem, it is also one of the characteristics of the present invention that the upper limit of the total amount of both elements to be added have been found out. It is still another characteristic of the present invention that the high hot corrosion resistance which conventional single crystal alloys do not possess has been obtained in the range of the alloy composition having higher additive amount of molybdenum which produces good effect on the specific gravity of an alloy.

Among conventional alloys, an alloy which is disclosed by the U.S. Pat. No. 4,719,080 (JP-A-61-284545) contains PWA1484. However, niobium is present in an alloy having a wide range of additive amount of niobium, but it is not sufficiently present in a preferable range. An alloy containing niobium is not seen in example. Besides, the invention disclosed by the above-mentioned United States Patent discloses that the "P" value in the formula (1) shown on the below is between 3360–4850 in a wide range of the composition, and more preferably, between 3800–4400. (a value in the formula (1) is to be indicated as % by weight.)

$$P = -200Cr + 80Mo - 20Mo^2 - 250Ti^2 - \\ 50(Ti \times Ta) + 15Nb + 200W - 14W^2 + 30Ta - 1.5Ta^2 + \\ 2.5Co + 1200Al - 100Al^2 + 100Re + 1000Hf - \\ 2000Hf^2 + 700Hf^3 - 2000V - 500C - 15000B - 500Zr \quad (1)$$

The value "P" may represent the rate of which each element contributes to the strength of an alloy. The values "P" of an alloy of the present invention in the examples have been calculated for a reference. Although each value is under 3360, sufficient high temperature strength can be obtained. Each value P is below 3360 mainly due to a comparatively high amount of chromium and a comparatively low amount of tantalum. However, an alloy of the present invention is able to obtain high temperature strength regardless of the value "P", and therefore, the formula (1) is not suitable whatsoever for calculating high temperature strength. Thus, the alloy in the above-mentioned invention is of different nature from that of the present invention.

A highly hot corrosion resistant and high-strength superalloy according to the present invention can be single-crystallized by employing a unidirectional solid casting method. Single crystal members produced by employing such a single crystal superalloy, such as blades and nozzles of a gas turbine, posses high hot corrosion resistance and high strength, and the combustion efficiency of a present gas turbine is enhanced by the performance of such members. Moreover, an unprecedented high-efficiency gas turbine can be produced by employing blades and nozzles using a single crystal superalloy according to the present invention.

Furthermore, by utilizing such a high-efficiency gas turbine together with a steam turbine in a combined power generation, a high-efficiency combined cycle power generation system which has 50% or greater of the heat efficiency can be obtained.

A first aspect of the present invention obtained as the result of the foregoing detailed examination is a highly hot corrosion resistant and high-strength superalloy consisting essentially of, by weight, 6–12% chromium, 4.5–6.5% aluminium, 2–12% tungsten, 2.5–10% tantalum, not more than 5.8% molybdenum, 0.1–3% cobalt, 0.2–3% niobium, 0.1–4% rhenium, not more than 0.3% hafnium, and the balance being nickel and unavoidable impurities.

More particularly, the composition producing a relatively lower specific gravity of a highly hot corrosion resistant and high-strength superalloy is, by weight, 6–12% chromium, 4.5–6.5% aluminium, not more than 11.5% in total of tungsten and tantalum which is composed of 2–9% tungsten and 2.5–8% tantalum, not less than 3% but not more than 5.8% molybdenum, 0.1–3% cobalt, 0.2–3% niobium, 0.1–1.65% rhenium, not more than 0.3% hafnium, and the balance being nickel and unavoidable impurities.

In the case where high strength is particularly demanded, a highly hot corrosion resistant and high-strength superalloy consisting essentially of, by weight, 7.3–10.5% chromium, 4.5–5.4% aluminium, not more than 17% in total of tungsten and tantalum which is composed of 4–12% tungsten and 2.5–9% tantalum, not more than 2% molybdenum, 0.1–3% cobalt, 0.2–2.5% niobium, 0.1–1.65% rhenium, not more than 0.13% hafnium, and the balance being nickel and unavoidable impurities is suitable.

In the case where excellent oxidation resistance is demanded, a highly hot corrosion resistant and high-strength superalloy consisting essentially of, by weight, 7.3–12% chromium, 4.5–6.5% aluminium, not more than 15% in total of tungsten and tantalum which is composed of 4–9% tungsten and 4.5–9% tantalum, not more than 1% molybdenum, 0.1–3% cobalt, 0.2–2% niobium, 0.1–1.65% rhenium, not more than 0.13% hafnium, the balance being nickel and unavoidable impurities is suitable.

In the case where both of excellent high temperature strength and hot corrosion resistance are demanded, a highly hot corrosion resistant and high-strength superalloy consisting essentially of, by weight, 7.3–12% chromium, 4.5–5.5% aluminium, not more than 15% in total of tungsten and tantalum which is composed of 4–9% tungsten and 4.5–9% tantalum, not more than 1.8% molybdenum, 0.1–2.5% cobalt, 0.8–2.5% niobium, 0.1–1.65% rhenium, not more than 0.13% hafnium, and the balance being nickel and unavoidable impurities is suitable.

In the case where all of the factors, high temperature strength, high temperature ductility, and hot corrosion and oxidation resistance are demanded, the best balanced composition consisting of a highly hot corrosion resistant and high-strength superalloy is 7.3–9% chromium, 4.7–5.5% aluminium, 5–6.3% tungsten, 5–7.5% tantalum, 0.5–1.8% molybdenum, 0.5–1.5% cobalt, 1.3–1.8% niobium, 1.3–1.65% rhenium, not more than 0.13% hafnium, and the balance nickel and being unavoidable impurities.

In the case where hot corrosion resistance is demanded more than oxidation resistance, a highly hot corrosion resistant and high-strength superalloy consisting essentially of, by weight, 7–12% chromium, 4.8–6.5% aluminium, 4–9% tungsten, 2.5–9% tantalum, not more than 5% molybdenum, 0.1–3% cobalt, not less than 2% and not more than 3% niobium, 0.1–4% rhenium, not more than 0.3% hafnium, and the balance being nickel and unavoidable impurities is suitable.

A second aspect of the present invention is a highly hot corrosion resistant and high-strength single crystal casting which is produced by directionally solidifying the foregoing alloy and which has substantially no grain boundary.

A third aspect of the present invention is a gas turbine blade formed of the highly hot corrosion resistant and high-strength single crystal casting according to the second aspect of the present invention.

In the case where the gas turbine blade is utilized for a land-based gas turbine, a construction thereof having a wing against which the high temperature gas strikes; a platform portion and a sealfin which seal the high temperature gas; a shank portion which supports both said portions; and a dovetail portion which is firmly connected on a disk is effective for improving the heat efficiency.

Furthermore, in the case where these gas turbine blades are utilized for a land-based gas turbine which outputs 25,000 KW or more of power, the gas turbine blades are required to longitudinally have a whole length of not less than 150 mm.

A fourth aspect of the present invention is a gas turbine nozzle formed of the highly hot corrosion resistant and high-strength single crystal casting as described above.

In the case where the gas turbine nozzle is utilized for a land-based gas turbine which outputs 25,000 KW or more of power, a gas turbine nozzle having a vane and side walls formed on both ends of the vane, and whose vane has a width of not less than 70 mm between the side walls on both ends of the vane and a length of not less than 100 mm from the inlet to the outlet into and out of which the combustion gas flows, is effective for improving heat efficiency.

A fifth aspect of the present invention is a gas turbine which rotates blades by burning air compressed in a compressor and by blowing the high temperature gas through a gas turbine nozzle against each gas turbine blade of the third aspect of the present invention firmly connected to a plurality of disks.

A sixth aspect of the present invention is a gas turbine which rotates blades by burning air compressed in a compressor and by blowing the high temperature gas through the gas turbine nozzle of the fourth aspect of the present invention against each gas turbine blade firmly connected to a plurality of disks.

A seventh aspect of the present invention is a gas turbine which rotates blades by burning air compressed in a compressor and by blowing the high temperature gas through the gas turbine nozzle of the fourth aspect of the present invention against each gas turbine blade of the third aspect of the present invention firmly connected to a plurality of disks.

A eighth aspect of the present invention is a combined cycle complex power generation system having a gas turbine driven by a high temperature gas which flows at a high speed, an exhaust heat recovery boiler obtaining steam from the energy of the gas exhausted by the gas turbine, a steam turbine driven by the steam, and a power generator driven by the gas turbine and the steam turbine, comprising 50% or greater of the heat efficiency of a whole plant, by employing any of the gas turbine as described in the fifth—the seventh aspects of the present invention.

In particular, the present invention is a combined cycle complex power generation system comprising a gas turbine driven by a high temperature gas which flows at a high speed, an exhaust heat recovery boiler obtaining steam from the combustion gas exhausted by the gas turbine, a steam turbine driven by the steam, and a power generator driven by the gas turbine and the steam turbine, wherein the blade of the gas turbine has three or more stages; and wherein the temperature of the combustion gas is 1,300° C. or higher at the inlet of the first stage of the blade; and wherein the temperature of the combustion exhausted gas is 560° C. or higher at the outlet of the turbine; and wherein the steam at a temperature of 530° C. or higher is obtained from the exhaust heat recovery boiler; and wherein the steam turbine is a high-and-low pressure integrated type; and wherein the steam temperature is 530° C. or higher at the first stage of the blade of the steam turbine; and wherein the power generation capacity of the gas turbine is 50,000 KW or greater and the power generation capacity of the steam turbine is 30,000 KW or greater; and wherein the total heat efficiency is 50% or higher; and wherein the foregoing single crystal alloy is utilized for the first stage of the blade of the gas turbine.

DESCRIPTION OF THE PREFERRED EMBODIMENTS

Figure 1:
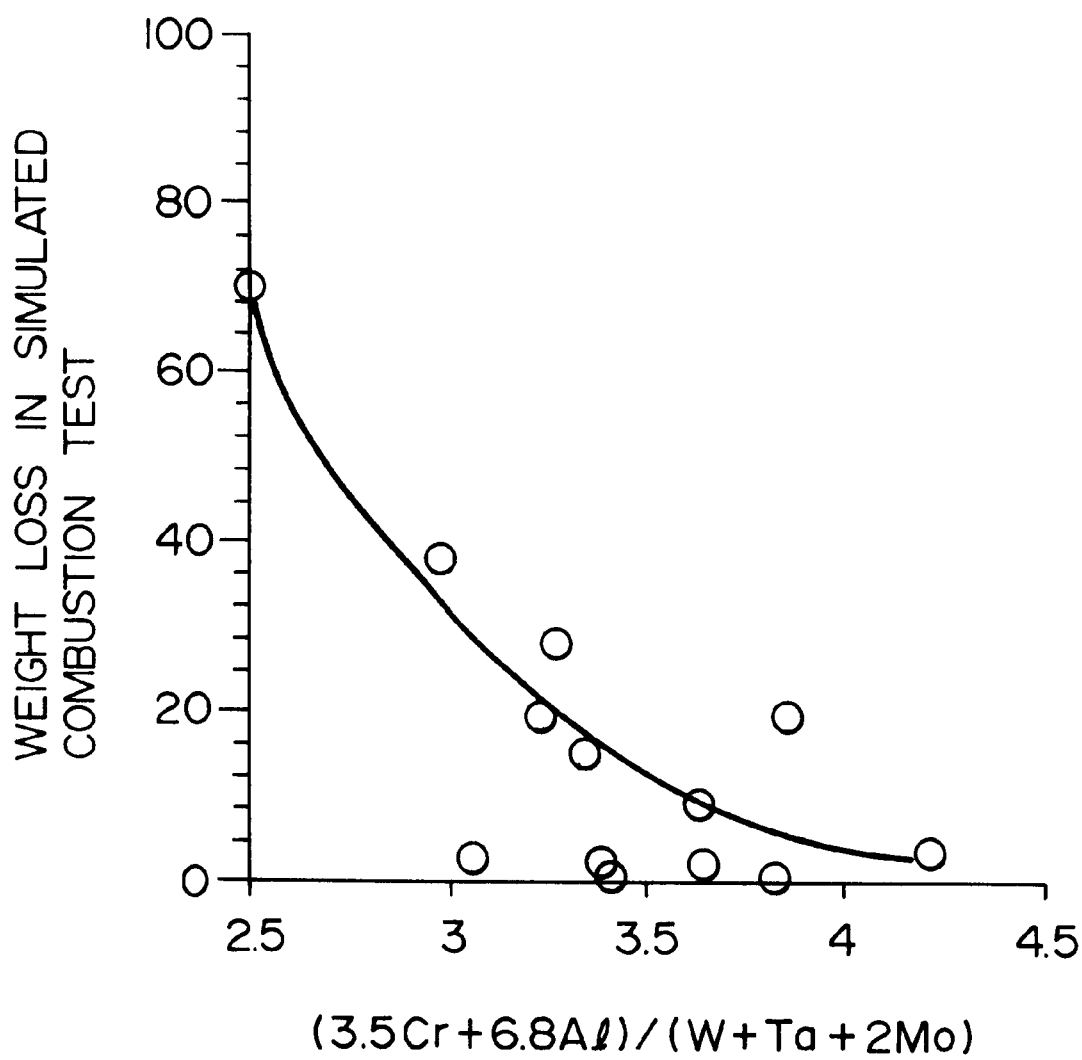
FIG. 1 is a chart showing the relationship between a mass loss by corrosion after a simulated combustion test and a ratio of (3.5Cr+6.8Al)/(W+Ta+2Mo)

The reasons for defining the components of an alloy according to the present invention will be explained hereinafter.

At least 6% chromium is required because it acts on improving hot corrosion and oxidation resistance of an alloy. Nevertheless, the excessive addition of chromium causes a harmful precipitated phase, such as sigma-phase, and further reduces the creep rupture strength and ductility. Thus, the additive amount of chromium is defined as between 6–12%, and more preferably, not less than 7%, and even more preferably, not less than 7.3%.

Aluminium is an important element for forming a protective aluminium oxide layer which most contributes to the improvement of high temperature oxidation of a nickel-base heat resistance superalloy. Thus, a considerably large amount of aluminium is desirable.

At the same time, aluminium is also a major former element for forming $\gamma'$-phase, which is an intermetallic compound strengthening a nickel-base heat resistance superalloy by precipitating $\gamma'$-phase. $\gamma'$-phase is basically composed of $Ni_3Al$, but it is further strengthened by dissolving other elements except for aluminium, such as titanium, tantalum, tungsten, molybdenum and niobium. The action of these elements will be described in detail hereinafter.

A single crystal alloy generally contains a large amount of $\gamma'$-phase whose ratio is 50% or greater at volume rate. A course $\gamma'$-phase, which is referred to as eutectic $\gamma'$-phase, is present in the finally solidified portion at the time when the solidification is completed. Thus, a solid solution treatment at a high temperature is performed for dissolving $\gamma'$-phase in a $\gamma$-phase. $\gamma'$-phase which is dissolved by the solid solution treatment is finely precipitated during cooling or the following aging treatment, thereby strengthening the alloy.

In order to achieve the above-mentioned action, at least 4.5% aluminium is required. However, the excessive addition, more than 6.5% aluminium causes excessive $\gamma'$-phase. Therefore, eutectic $\gamma'$-phase cannot be completely dissolved by the solid solution treatment, thereby undesirably reducing the strength of the alloy. Besides, a relatively larger amount of aluminium than that of solid-solution strengthening elements of $\gamma'$-phase, such as tantalum, tungsten, molybdenum and niobium, also means that $\gamma'$-phase is not sufficiently strengthened by solid solution hardening.

Hence, in the present invention, the amount of aluminium is defined as in a range of between 4.5–6.5%. In particular, for the purpose of improving a high temperature strength, a low percentage, not more than 5.5%, of the additive amount of aluminium is desirable. Not more than 5.4% of the additive amount is desirable for the purpose of improving higher temperature strength. A most preferable range of aluminum is 4.7–5.5%.

Tungsten is an element for being dissolved in γ-phase and γ'-phase, thereby strengthening both phases. Thus, at least 2% tungsten is required. However, an excessive addition precipitates a-tungsten phase and rhenium-tungsten phase, thus reducing the strength of an alloy and further lowering the hot corrosion resistance at a high temperature and increasing the specific gravity. Therefore, the additive amount of tungsten is defined at 2–12%, and more preferably, as not less than 4% for the purpose of the strength. A range of 4–9% is preferable in order to achieve a good balance of specific gravity, strength and hot corrosion resistance, and preferably 5–9%, more preferably 5–6.3%.

Molybdenum is an indispensable additive element for being dissolved in γ-phase and γ'-phase and strengthening both phases as well as tungsten. Nevertheless, an excessive addition precipitates α-molybdenum phase and rhenium-molybdenum phase, thus reducing the strength of an alloy and further lowering hot corrosion resistance at a high temperature. Therefore, the additive amount of molybdenum is defined as not more than 5.8%, and particularly for the purpose of lowering specific gravity, the additive amount of more than 3% molybdenum and an accompanying reduction in the total amount of tungsten and tantalum is effective. Conversely, however, a low amount of molybdenum is effective for the purpose of hot corrosion and oxidation resistance, and it is preferably not more than 5%, and more preferably, not more than 2%, and even more desirably, not more than 1.8%, and even further more desirably, not more than 1%. Further considering strength as well as hot corrosion resistance and oxidation resistance, 0.2–1.8% is preferred, more preferably, from 0.2% to not more than 1.8%.

Cobalt is an important element for forming an alloy of the present invention. An optimal amount of cobalt defined below is to be added to the alloy of the present invention for definitely improving its hot corrosion and oxidation resistance. In terms of strength, the addition of cobalt reduces the stacking fault energy of the alloy, and enhances the creep strength in a relatively lower range of temperatures, but also increases the dissolving degree of γ'-phase in a relatively higher range of temperatures and hence undesirably lowers the characteristics of precipitating and strengthening γ'-phase, thus reducing the creep strength in a higher range of temperatures. Due to these two conflicting actions, an optimal amount of cobalt defined below is to be added in terms of the strength. In order to produce a good effect, at least 0.1% cobalt is required to be added. However, the addition of more than 3% cobalt is no longer effective towards hot corrosion and oxidation resistance. Such excess addition also reduces high temperature strength and facilitates the production of a harmful phase, which is referred to as TCP (topologically close-packed phase). Thus the additive amount of cobalt is defined as between 0.1–3.0%, preferably 0.3–2.0%, more preferably 0.5–1.5%.

In a single crystal alloy containing niobium and rhenium, it is one of the characteristics of the present invention that such an alloy also contains the defined amount of cobalt as described above, and more preferably between 0.1–2.5%.

In the present invention, niobium is an indispensable additive element together with rhenium for enhancing the hot corrosion resistance of the alloy. It is one of the features which characterize the present invention that the positive effect of niobium on improving hot corrosion resistance has been found out. In particular, it is a totally novel discovery that hot corrosion resistance is improved by adding niobium together with rhenium. It is believed that at least 0.2% niobium is required to be added to achieve such an effect, though the mechanism of improving hot corrosion resistance is not disclosed at present. Niobium is basically dissolved in γ'-phase and strengthens γ'-phase. However, it has a smaller influence than its homologous tantalum, and an excessive addition of more than 3% niobium undesirably reduces the amount of tantalum which is dissolved in γ'-phase, thus reducing high temperature strength.

Therefore, niobium is defined as between 0.2–3.0% in the present invention. However, an excessive addition of niobium is not desirable for the purpose of oxidation resistance, and between 0.2–2.5% is preferable. On the other hand, the addition of more than 2% but not more than 3% is preferable, particularly for the purpose of high hot corrosion resistance. Considering strength as well as corrosion resistance, 0.8–2.5% is preferred, more preferably 1.3–1.8%.

Tantalum as well as niobium is basically strengthens γ'-phase by solid solution hardening. Thus, at least 2.5% tantalum is needed, but an excessive addition of more than 10% causes an increase in the dissolving temperature of eutectic γ'-phase and the precipitation of rhenium-tantalum phase, thereby undesirably reducing high temperature strength. Thus, the amount of tantalum is defined as between 2.5–10%. In particular, with a view to achieving high strength, not less than 4.5%, and more preferably, not less than 5% is desirable. On the other hand, an excessive addition is not desirable in terms of hot corrosion resistance, and an additive amount of not more than 9% is desirable in that case, more preferably 5–7.5%.

Rhenium has a positive effect on raising hot corrosion resistance of an alloy as well as on solid solution strengthening γ-phase. Nonetheless, such an effect is exerted to such a degree that rhenium can endure long hours of use at a high temperature in a land-based gas turbine only when it is used together with niobium. At least 0.1% rhenium is required to achieve such a degree. On the other hand, however, rhenium is a very expensive element and an excessive addition of more than 4% not only increases the cost of an alloy but causes the precipitation of harmful phases, such as rhenium-tungsten, rhenium-molybdenum and rhenium-tantalum. Thus, the amount of rhenium is defined as between 0.1–4.0%. The effective additive range of rhenium is between 0.1–1.65% particularly in terms of the cost of an alloy and specific gravity thereof, more preferably 1.3–1.65%.

Hafnium is an indispensable additive element since it is important for improving oxidation resistance and the high temperature strength of an alloy. Only a small amount of hafnium is required to produce such an effect. However, an excessive addition of hafnium lowers a melting point of an alloy and thus reduces the solid solution treatment temperature, whereby eutectic γ'-phase cannot be sufficiently dissolved. Therefore, the additive amount of hafnium is to be as small as possible, not more than 0.3%, and more preferably, not more than 0.13% is suitable.

Among the alloy elements as described above, tungsten and tantalum are major elements for solid solution and strengthening γ-phase and γ'-phase. It is highly significant to define a total amount of both tungsten and tantalum as well as the individual range of additive amount. When the total amount of tungsten and tantalum is great, α-tungsten phase and undissolved eutectic γ'-phase are left, which disadvantageously causes a reduction in the high temperature strength and an increase in the specific gravity of an alloy even though the strength of an alloy is improved. Hot corrosion resistance is also reduced. In order to solve this problem, the total amount of tungsten and tantalum is desirably not more than 17%, and more desirably, not more than 15%, more preferably not more than 14.5% for the purpose of improving hot corrosion resistance. Moreover, in order to reduce the specific gravity of an alloy, it is effective to increase the amount of molybdenum and to add not more than 11.5% the total amount of tungsten and tantalum. However, since a small total amount of tungsten and tantalum reduces high temperature strength, the additive amount is required to be adjusted according to the purposes.

Conventional single crystal alloys usually contain titanium. Although titanium is dissolved in γ'-phase and acts on solid solution strengthening γ'-phase, it easily produces eutectic γ'-phase and lowers the melting point of an alloy. Therefore, the difference between the incipient melting temperature and the solidus temperature of γ'-phase, that is, heat treatment window, is narrowed and whereby γ'-phase cannot be dissolved sufficiently by employing the solid solution treatment. Thus, titanium is not added to the alloy of the present invention.

Except for the foregoing elements, carbon, silicon, manganese, phosphorus, sulfur, boron, zirconium, yttrium, REM and copper can be added within the ranges as shown below without any particular characteristic problems, but an extremely small amount is desirable.

| | | |
|---|---|---|
| C ≤ 0.015% | Si ≤ 0.05% | Mn ≤ 0.5% |
| P ≤ 0.005% | S ≤ 0.003% | B ≤ 0.003% |
| Zr ≤ 0.02% | Y ≤ 0.2% | REM ≤ 0.2% |
| Cu ≤ 0.1% | | |

The high temperature strength of the alloy largely depends on the addition of tungsten, tantalum, rhenium and molybdenum, and the effect is generally in proportion to the atom %. Therefore, in order to obtain the targeted high temperature creep rupture strength, not only the additive ranges of the individual elements are appropriate, but also the total sum of the following formula indicated by weight %, (W+Ta+Re+2Mo), is required to be not less than 14.

On the other hand, chromium and niobium have a positive effect on corrosion resistance, and tungsten, tantalum and molybdenum have a negative effect thereon. Rhenium basically improves corrosion resistance of the alloy but as the additive amount increases, it causes the precipitation of harmful phases which results in lowering corrosion resistance. Thus, rhenium cannot be included as a primary element in-the following formula as a characteristic of corrosion resistance. If the characteristic of corrosion resistance is indicated by atom % as in the strength, not only the additive ranges of the individual elements are appropriate, but also a total sum of the following formula indicated by weight %, (W+Ta+Re+2Mo)/(3.5Cr+2Nb), is required to be not more than 0.95 in order to obtain the targeted high temperature corrosion resistance.

It is highly preferable that a ratio of the former formula and the latter formula be in a range of A (26.0, 0.95), B (22.0, 0.95), C (14.0, 0.6), D (14.0, 0.1) and E (26.0, 0.6).

γ'-phase has 50–67% of the volume rate so that high strength can be obtained, and it has a shape of a cube or a rectangular prism. The thermal treatment and the alloy composition are preferably adjusted so that a side length of γ'-phase is not more than 0.5 μm, and more particularly, 0.05–0.3 μm on the average. It is particularly preferable that the volume rate be between 55–65%.

A preferable alloy composition according to the present invention is 7.0–8.5% (8.0%) chromium, 1–2% (1.6%) rhenium, 0.5–1.5% (1.0%) molybdenum, 5.5–7.5% (6.0%) tungsten, 6.5–8.0% (7.0%) tantalum, 1–2% (1.5%) niobium, 4.5–5.5% (5.0%) aluminium, 0.5–1.5% (1.0%) cobalt, 0.02–0.13% (0.10%) hafnium, and the balance substantially being nickel. The percentages in parenthesis are more preferably amounts of alloying elements. The present invention comprises a master ingot and a single crystal alloy casting, each having such a composition. It is preferable that a desired aging treatment be performed and that the volume rate of γ'-phase be 55–65% for high strength members. γ-phase, which is a base phase, and γ'-phase differ from each other but they are matched phases having the same crystal orientation, and thus are generally referred to as a single crystal.

It is preferable that the present invention have characteristics such that creep rupture time at a temperature of 1040° C. at 19 kgf/mm$^2$ is not less than 100 hours and that a mass loss by corrosion under a total immersion in 75%, by weight, sodium sulfate and 25%, by weight, sodium chloride at a temperature of 940° C. for 50 hours in the atmosphere is not more than 300 mg/cm$^2$.

A highly hot corrosion resistant and high-strength single crystal casting produced by directionally solidifying the above-mentioned novel materials is suitable for a product which is used in a harsh environment and for which high creep rupture strength and excellent hot corrosion and oxidation resistance are required.

Since a gas turbine blade and a gas turbine nozzle formed of the above-mentioned highly hot corrosion resistant and high-strength single crystal casting possess high creep rupture strength and excellent hot corrosion and oxidation resistance, it is possible to increase the combustion gas temperature of a gas turbine to higher than that of gas turbines currently being used. As a result, the heat efficiency of a gas turbine is remarkably improved.

A combined cycle power generation system achieved by utilizing the above-mentioned gas turbine has 50% or greater heat efficiency as a whole system because the combustion gas temperature of the gas turbine is higher than that of conventional gas turbines.

EXAMPLE 1

Table 1 shows the chemical composition and the total value of tungsten and tantalum of samples used for comparing the characteristics of comparative alloys, conventional alloys, and alloys according to the present invention, as well as the P value in order to prove that the alloy composition and an accompanying effect of the present invention totally differs from those of the alloy disclosed in the U.S. Pat. No. 4,719,080. 5 kg of master ingots of all the alloys of the present invention No. 1–32, the comparative alloys No. 41–54 and the conventional alloys No. 61–64 were produced by employing a vacuum induction melting method. The conventional alloys were aimed at having the identical composition as that which has been disclosed and they were melted.

Among the conventional alloys, No. 61 represents SC-83K, No. 62 PWA1484, No. 63 CMSX-4, No. 64 Rene 80.

TABLE 1

| TYPE OF ALLOY | ALLOY NO. | CHEMICAL COMPOSITION (wt %) | | | | | | | | | | | "P" |
|---|---|---|---|---|---|---|---|---|---|---|---|---|---|---|
| | | Ni | Cr | W | Mo | Co | Al | Ti | Nb | Ta | Re | Hf | W + Ta | VALUE |
| INVENTION ALLOY | 1 | Bal. | 6.8 | 6.7 | 4.4 | 0.8 | 5.1 | — | 1.8 | 4.1 | 1.5 | 0.1 | 10.8 | 3193 |
| | 2 | Bal. | 6.9 | 6.9 | 4.3 | 0.5 | 5.2 | — | 1.8 | 4.1 | 0.8 | 0.1 | 11.0 | 3130 |
| | 3 | Bal. | 6.4 | 6.1 | 5.4 | 1.0 | 4.9 | — | 1.2 | 5.3 | 1.6 | 0.1 | 11.4 | 3125 |
| | 4 | Bal. | 6.5 | 6.1 | 5.4 | 1.0 | 4.8 | — | 1.7 | 4.6 | 1.6 | 0.1 | 10.7 | 3079 |
| | 5 | Bal. | 7.0 | 2.3 | 5.5 | 1.1 | 4.8 | — | 1.7 | 7.7 | 1.6 | 0.1 | 10.0 | 2688 |
| | 6 | Bal. | 8.1 | 8.5 | 0.9 | 0.9 | 4.6 | — | 1.6 | 7.5 | 1.6 | 0.1 | 16.0 | 2936 |
| | 7 | Bal. | 7.9 | 9.5 | 0.9 | 1.0 | 4.6 | — | 1.6 | 6.7 | 1.6 | 0.2 | 16.2 | 2962 |
| | 8 | Bal. | 7.8 | 7.2 | 1.8 | 0.8 | 4.7 | — | 1.6 | 7.5 | 1.6 | 0.1 | 14.7 | 3072 |
| | 9 | Bal. | 7.2 | 11.5 | 1.8 | 0.7 | 4.7 | — | 1.6 | 3.8 | 1.6 | 0.1 | 15.3 | 2877 |
| | 10 | Bal. | 7.6 | 8.1 | 1.8 | 1.2 | 4.7 | — | 1.2 | 7.5 | 1.6 | 0.1 | 15.6 | 3094 |
| | 11 | Bal. | 7.7 | 7.9 | 1.8 | 1.5 | 4.8 | — | 1.6 | 6.1 | 1.6 | 0.2 | 14.0 | 3142 |
| | 12 | Bal. | 6.9 | 9.2 | 0.9 | 1.5 | 5.2 | — | 0.9 | 5.4 | 1.6 | 0.1 | 14.6 | 3243 |
| | 13 | Bal. | 8.1 | 5.0 | 0.9 | 1.1 | 5.5 | — | 0.9 | 8.2 | 3.0 | 0.1 | 13.2 | 3203 |
| | 14 | Bal. | 7.5 | 9.5 | 0.8 | 1.0 | 5.2 | — | 0.9 | 7.2 | 1.4 | 0.1 | 16.7 | 3099 |
| | 15 | Bal. | 7.1 | 6.6 | 4.4 | 1.0 | 5.1 | — | 2.7 | 2.7 | 1.5 | 0.1 | 9.3 | 3118 |
| | 16 | Bal. | 7.7 | 8.2 | 0.9 | 2.1 | 5.4 | — | 0.9 | 6.5 | 1.5 | 0.1 | 14.7 | 3160 |
| INVENTION ALLOY | 17 | Bal. | 7.6 | 9.2 | 0.8 | 0.9 | 5.3 | — | 0.9 | 6.4 | 1.5 | 0.1 | 15.6 | 3114 |
| | 18 | Bal. | 7.5 | 8.3 | 0.8 | 1.4 | 4.9 | — | 2.2 | 7.2 | 1.5 | 0.1 | 15.5 | 3131 |
| | 19 | Bal. | 7.6 | 7.3 | 0.8 | 0.9 | 4.9 | — | 2.2 | 8.0 | 1.5 | 0.1 | 15.3 | 3134 |
| | 20 | Bal. | 8.0 | 6.1 | 1.6 | 1.1 | 5.0 | — | 1.5 | 6.9 | 1.6 | 0.1 | 13.0 | 3077 |
| | 21 | Bal. | 7.4 | 5.9 | 1.5 | 0.8 | 5.3 | — | 1.6 | 7.3 | 1.5 | 0.1 | 13.2 | 3234 |
| | 22 | Bal. | 7.7 | 7.9 | 0.9 | 1.0 | 5.6 | — | 0.9 | 5.7 | 1.5 | 0.1 | 13.6 | 3175 |
| | 23 | Bal. | 7.8 | 5.2 | 0.8 | 1.0 | 5.3 | — | 1.6 | 8.8 | 1.5 | 0.1 | 14.0 | 3109 |
| | 24 | Bal. | 7.5 | 7.0 | 0.8 | 0.8 | 5.3 | — | 1.6 | 7.3 | 1.5 | 0.1 | 14.3 | 3212 |
| | 25 | Bal. | 7.3 | 8.6 | 0.8 | 1.1 | 5.3 | — | 1.6 | 5.8 | 1.5 | 0.1 | 14.4 | 3208 |
| | 26 | Bal. | 7.6 | 6.3 | 0.8 | 0.7 | 5.5 | — | 1.5 | 6.9 | 1.5 | 0.1 | 13.2 | 3201 |
| | 27 | Bal. | 7.5 | 7.2 | 0.8 | 0.8 | 5.0 | — | 1.7 | 8.8 | 1.4 | 0.1 | 16.0 | 3161 |
| | 28 | Bal. | 7.3 | 5.4 | 0.5 | 0.8 | 6.0 | — | 1.4 | 7.0 | 1.4 | 0.1 | 12.4 | 3277 |
| | 29 | Bal. | 6.9 | 4.4 | 1.3 | 0.7 | 6.0 | — | 1.4 | 7.1 | 1.4 | 0.1 | 11.5 | 3280 |
| | 30 | Bal. | 7.8 | 5.0 | 1.0 | 0.8 | 5.4 | — | 2.7 | 4.7 | 2.5 | 0.1 | 9.7 | 3195 |
| | 31 | Bal. | 10.1 | 6.2 | 0.7 | 1.1 | 5.3 | — | 1.5 | 6.9 | 1.5 | 0.1 | 13.1 | 2670 |
| | 32 | Bal. | 11.4 | 6.4 | 0.7 | 2.2 | 4.9 | — | 1.4 | 6.5 | 1.6 | 0.1 | 12.9 | 2350 |
| COMPARATIVE ALLOY | 41 | Bal. | 7.3 | 6.5 | 4.5 | 1.2 | 5.0 | — | 3.5 | 0.9 | 1.5 | 0.1 | 7.4 | 3015 |
| | 42 | Bal. | 6.6 | 6.7 | 4.2 | 1.2 | 5.4 | — | — | 7.3 | 1.5 | 0.1 | 14.0 | 3312 |
| | 43 | Bal. | 7.1 | 7.1 | 4.2 | 1.0 | 4.8 | 1.6 | — | 5.7 | 1.5 | 0.1 | 12.8 | 1993 |
| | 44 | Bal. | 4.7 | 6.8 | 4.3 | 0.9 | 5.2 | — | 1.8 | 4.1 | 1.5 | 0.1 | 10.9 | 3641 |
| | 45 | Bal. | 6.9 | 6.9 | 4.3 | 0.8 | 5.2 | — | 1.8 | 4.1 | — | 0.1 | 11.0 | 3051 |
| | 46 | Bal. | 6.1 | 3.9 | 7.3 | 0.3 | 4.9 | — | 1.3 | 5.4 | 1.6 | 0.2 | 9.3 | 2768 |
| | 47 | Bal. | 6.2 | 8.4 | 0.8 | 1.2 | 5.5 | — | 0.9 | 5.6 | 4.3 | 0.1 | 14.0 | 3727 |
| | 48 | Bal. | 6.7 | 6.6 | 4.4 | 1.0 | 5.1 | — | 1.8 | 4.0 | 1.5 | — | 10.6 | 3129 |
| | 49 | Bal. | 6.8 | 6.7 | 4.5 | — | 5.0 | — | 1.9 | 4.1 | 1.4 | 0.1 | 10.8 | 3153 |
| | 50 | Bal. | 6.8 | 6.6 | 4.3 | — | 5.1 | — | 1.7 | 4.2 | 1.6 | — | 10 8 | 3128 |
| | 51 | Bal. | 6.7 | 6.7 | 4.5 | 5.2 | 5.1 | — | 1.8 | 4.0 | 1.5 | 0.1 | 10.7 | 3212 |
| | 52 | Bal. | 6.1 | 7.1 | 6.0 | 1.0 | 5.4 | — | 0.9 | 3.3 | 1.5 | 0.1 | 10.4 | 3148 |
| | 53 | Bal. | 8.6 | 6.0 | 1.0 | — | 5.4 | 1.0 | — | 7.9 | 0.8 | — | 13.9 | 2178 |
| | 54 | Bal. | 10.0 | 6.0 | 0.7 | 4.5 | 5.4 | 2.0 | — | 5.4 | 0.1 | — | 10.4 | 906 |
| CONVENTIONAL ALLOY | 61 | Bal. | 6.4 | 7.3 | 4.3 | 1.0 | 5.1 | — | — | 7.3 | — | 0.1 | 14.6 | 3149 |
| | 62 | Bal. | 5.1 | 6.0 | 2.0 | 9.9 | 5.5 | — | — | 8.6 | 2.9 | 0.1 | 14.8 | 3874 |
| | 63 | Bal. | 6.6 | 6.4 | 0.6 | 9.6 | 5.6 | 1.0 | — | 6.5 | 3.0 | 0.1 | 12.9 | 2973 |
| | 64 | Bal. | 14.0 | 3.9 | 3.9 | 9.3 | 3.0 | 5.0 | — | C: 0.17 | B: 0.016 | Zr: 0.03 | 3.9 | — |

Table 2 shows (i) the average value of weight loss by hot corrosion of three of each alloy as a result of a total immersion test in a salt mixture composed of 75% wt sodium sulfate and 25% wt sodium chloride contained in a crucible at a temperature of 940° C. for 50 hours, (ii) the value of oxidation weight loss after repeating the thermal cycle ten times by air cooling preceded by heating for 16 hours at a temperature of 1100° C. in the crucible, (iii) the structural stability of the alloys, (iv) the creep rupture time at a temperature of 1040° C. and at 19 kgf/mm² and (v) elongation of the alloys at that time, and (vi) the value of weight loss after the simulated combustion and hot corrosion test. As for the structural stability of an alloy, an alloy only formed of γ-phase and γ'-phase is indicated as "O" under the column of the characteristics and an alloy containing a harmful phase except for γ-phase and γ'-phase is indicated as "x" under the column of the characteristics, judging from a microstructure of an alloy after each heat treatment.

TABLE 2

| TYPE OF ALLOY | ALLOY NO. | CREEP RUPTURE CHARACTERISTICS | | CORROSION AND OXIDATION RESISTANCE WEIGHT LOSS (mg/cm²) | | | STRUCTURAL STABILITY |
|---|---|---|---|---|---|---|---|
| | | LIFE (h) | ELONGATION (%) | CORROSION TEST IN CRUCIBLE | SIMULATED COMBUSTION TEST | OXIDATION TEST IN CRUCIBLE | |
| INVENTION ALLOY | 1 | 169 | 8.3 | 0.3 | 37.7 | −0.6 | ○ |
| | 2 | 133 | 21.2 | 1.8 | — | 1.1 | ○ |
| | 3 | 159 | 12.6 | 277 | 69.7 | 18.3 | ○ |
| | 4 | 145 | 20.5 | 0.6 | — | 19.1 | ○ |
| | 5 | 199 | 9.4 | 0.6 | — | 6.3 | ○ |
| | 6 | 227 | 8.3 | 255 | 14.7 | 0.1 | ○ |
| | 7 | 236 | 7.8 | 263 | 27.6 | 1.8 | ○ |
| | 8 | 208 | 11.2 | 273 | 19.0 | 2.5 | ○ |
| | 9 | 199 | 10.5 | 1.5 | — | 14.4 | ○ |
| | 10 | 223 | 12.1 | 240 | 2.7 | 0.7 | ○ |
| | 11 | 188 | 13.3 | 0.5 | 0.4 | 1.3 | ○ |
| | 12 | 134 | 26.4 | 0.7 | 1.6 | 0.4 | ○ |
| | 13 | 164 | 16.6 | 238 | — | 0.1 | ○ |
| | 14 | 229 | 15.4 | 289 | 2.2 | 2.3 | ○ |
| INVENTION ALLOY | 15 | 137 | 25.3 | 1.5 | — | 19.6 | ○ |
| | 16 | 164 | 20.1 | 258 | 19.2 | 0.9 | ○ |
| | 17 | 208 | 13.7 | 273 | 8.7 | 1.7 | ○ |
| | 18 | 205 | 7.8 | 1.2 | — | 5.4 | ○ |
| | 19 | 223 | 8.2 | 0.8 | — | 4.4 | ○ |
| INVENTION ALLOY | 20 | 188 | 18.4 | 0.3 | 0.7 | 0.4 | ○ |
| | 21 | 193 | 18.1 | 0.3 | 0.4 | 0.3 | ○ |
| | 22 | 164 | 13.2 | 1.1 | 3.3 | 0.5 | ○ |
| | 23 | 220 | 7.6 | 0.3 | — | 0.4 | ○ |
| | 24 | 218 | 9.4 | 0.5 | — | 1.0 | ○ |
| | 25 | 207 | 10.3 | 0.3 | — | 1.2 | ○ |
| | 26 | 163 | 16.4 | 0.3 | — | 0.2 | ○ |
| | 27 | 244 | 6.7 | 203 | — | 1.1 | ○ |
| | 28 | 118 | 11.4 | 0.5 | — | −0.2 | ○ |
| INVENTION ALLOY | 29 | 113 | 12.3 | 1.6 | — | 0.3 | ○ |
| | 30 | 101 | 14.4 | 1.5 | — | 17.7 | ○ |
| | 31 | 161 | 16.4 | 0.2 | — | 0.4 | ○ |
| | 32 | 130 | 8.8 | 0.3 | — | −0.3 | ○ |
| COMPARATIVE ALLOY | 41 | 73 | 9.8 | 1.6 | — | 30.3 | ○ |
| | 42 | 265 | 10.4 | 528 | — | 1.9 | ○ |
| | 43 | 51 | 7.3 | TOTALLY MELTED | — | 2.7 | X |
| | 44 | 133 | 18.3 | 520 | — | 92.4 | ○ |
| | 45 | 101 | 22.2 | 533 | — | 2.3 | ○ |
| | 46 | 152 | 12.2 | TOTALLY MELTED | — | 75.2 | ○ |
| | 47 | 67 | 5.9 | TOTALLY MELTED | — | 74.4 | X |
| | 48 | 146 | 17.3 | 156 | — | 37.3 | ○ |
| | 49 | 137 | 12.1 | 141 | — | 28.1 | ○ |
| | 50 | 132 | 14.0 | 244 | — | 55.3 | ○ |
| COMPARATIVE ALLOY | 51 | 98 | 10.8 | 507 | — | 44.2 | ○ |
| | 52 | 156 | 12.3 | 444 | — | — | ○ |
| | 53 | — | — | 429 | — | 20.2 | ○ |
| | 54 | — | — | 589 | — | 8.3 | ○ |
| CONVENTIONAL ALLOY | 61 | 242* | — | TOTALLY MELTED | — | 0.9 | ○ |
| | 62 | — | — | TOTALLY MELTED | — | 74.6 | ○ |
| | 63 | 143* | — | 533 | — | 8.0 | ○ |
| | 64 | — | — | 30 | 113 | 95.0 | ○ |

*CALCULATED BY LARSON-MILLER PARAMETER

In various tests shown in Table 2, except for the creep rupture test and the simulated combustion and hot corrosion test, the master ingots as cast in a polycrystal structure were heat-treated in a certain way and processed into certain pieces for testing, and thus they were provided as samples being tested. Disc-shaped pieces with a diameter of 7 mm and the thickness of 4 mm were processed for being tested as a sample piece for both the hot corrosion test in the crucible and as a sample piece for the oxidation test in the crucible.

Before the creep rupture test, the foregoing master ingots of all the alloys of the present invention and the comparative alloys except for No. 53 and No. 54 were single-crystallized in a withdrawal-type unidirectional solidifying furnace; then they were heat treated which is described below as in the other tests; they were further processed into sample pieces for testing whose diameter is 6.35 mm in a parallel portion and whose gage length is 25.4 mm. Then, the creep rupture test was carried out under the above-mentioned conditions based on ASTM method. Among the conventional alloys, as to the alloys No. 61 and No. 63 whose creep rupture curve calculated by Larson-Miller parameter is known to public, their rupture times corresponding to a temperature of 1040° C. at 19 kgf/mm² were obtained from the creep rupture curve and were indicated in Table 2.

The simulated combustion and hot corrosion test was carried out only on some of the alloys of the present invention and on the conventional alloy No. 64 (Rene 80). Samples having a single crystal structure of he alloys according to the present invention which samples were produced for the creep rupture test were used; on the other hand, the sample having a polycrystal structure of the conventional alloy No. 64 was used. After all these samples were processed into sample pieces having the shape of a round bar which has a diameter of 9 mm and a length of 50 mm, they were heated in seven cycles at a temperature of 900° C. for 7 hours in the atmosphere of which the combustion gas in an actual apparatus was simulated; then they were descaled. Then, the values of the hot corrosion weight loss were measured.

The solid solution treatment conditions performed on the alloys of the present invention and on the comparative alloys were defined after examining the structure in which they were heated at a temperature of between 1250°–1350° C. for 4 hours and cooled by air. The temperature at which γ'-phase was completely dissolved was basically selected as the solid solution treatment temperature of all of the alloys, at which temperature they were maintained for four hours followed by air cooling. As to aging conditions after the solid solution treatment, a two-stage aging treatment, that is, heating at a temperature of 1080° C. for four hours followed by air cooling and another heating at a temperature of 870° C. for twenty hours followed by air cooling, were executed.

As to the conventional alloys, No. 61 (SC-83K) was heat treated by heating at a temperature of 1320° C. for four hours followed by air cooling and by another heating at a temperature of 1080° C. for five hours followed by air cooling and by further heating at a temperature of 870° C. for twenty hours followed by air cooling. No. 62 (PWA1484) was heat-treated by heating heated at a temperature of 1316° C. for four hours followed by air cooling and by another heating at a temperature of 1080° C. for four hours followed by air cooling and by further at a temperature of 870° C. for twenty hours followed by air cooling.

No. 63 (CMSX-4) complied with the thermal conditions based on ("Fabrication and High Temperature Properties of Single Crystal Component of Advanced Ni-base Superalloys", Yoshio Ohta et al.; Iron and Steel, vol. 76, (1990), pp. 940–947) recommended by Cannon-Muskegon. Six-stage consecutive solid solution treatment was performed on No. 63; it was maintained at a temperature of 1272° C. for two hours followed by raising the temperature to 1296° C. where it was maintained for three hours followed by raising the temperature to 1313° C. where it was further maintained for three hours followed by raising the temperature to 1316° C. where it was still further maintained for two hours followed by air cooling. Then, an aging treatment was performed; it was maintained at a temperature of 1080° C. for four hours followed by air cooling and it was further maintained at a temperature of 871° C. for twenty hours followed by air cooling.

Among the conventional alloys, Rene 80 used as in a polycrystal structure was utilized after the heat treatment by air heating at a temperature of 1220° C. for two hours followed by air cooling and then by another heating at a temperature of 1096° C. for four hours followed by air cooling and by further heating at a temperature of 845° C. for sixteen hours followed by air cooling.

Table 1 shows that any of the "P" values of the alloys according to the present invention, which value is calculated by the previous formula (1), is under 3360 which value is disclosed in the U.S. Pat. No. 4,719,080, and consequently that the present invention is of a different nature from the above-mentioned invention. Table 2 shows that all the alloys of the present invention No. 1–32 possess good properties such as hot corrosion resistance, oxidation resistance, the good creep rupture life, creep rupture elongation and structural stability. Particularly for their hot corrosion resistance, the weight loss by hot corrosion in the crucible indicates the equivalent level or a closer level to that of No. 64 (Rene 80), and thus it is clear that hot corrosion resistance of the present invention is better than that of the conventional single crystal alloys. Furthermore, the weight loss by which the simulated combustion and hot corrosion test shows that the alloys of the present invention definitely possess better hot corrosion resistance than No. 64. Also, the alloys of the present invention are far better in oxidation resistance than No. 64 (Rene 80) and they are comparable to one of the conventional single crystal alloys having the best oxidation resistance.

The longest creep rupture life of the alloys according to the present invention is substantially equivalent to the life of the conventional single crystal alloy No. 61 (SC-83K) and even their shortest life is slightly less than the life of the conventional alloy No. 63 (CMSX-4). Judging from the creep rupture life, the strength of the alloys of the present invention has the most satisfactory level for a land-based gas turbine.

On the other hand, some of the comparative alloys have the individual characteristics comparable to those of the alloys of the present invention. However, all the good individual characteristics cannot be well-balanced in one conventional single crystal alloy unlike the alloys of the present invention. As is understood from the foregoing description, it is clear that the alloys having a range of composition according to the present invention show excellent well-balanced characteristics.

Among the conventional alloys, No. 61 (SC-83K) is excellent in creep rupture strength, and has good oxidation resistance since it contains a small amount of cobalt and hafnium, but has bad hot corrosion resistance since it neither contains rhenium nor niobium. No. 62 (PWA1484) contains rhenium but contains only a low proportion of chromium and no niobium, and consequently its hot corrosion and oxidation resistance is lower than that of the alloys of the present invention. No. 63 (CMSK-4) can obtain good oxidation resistance and creep rupture life, but its hot corrosion resistance is somewhat lower than that of the alloys of the present invention. A polycrystal member of the conventional alloys, No. 64 (Rene 80) has good hot corrosion resistance in the crucible but has lower hot corrosion resistance under the atmosphere in which the combustion gas in an actual apparatus is simulated than that of the alloys of the present invention, and it also has extremely low creep rupture strength and bad oxidation resistance.

FIG. 1 is a chart showing the relationship between a mass loss by corrosion after a simulated combustion test and a ratio of (3.5G+6.8Al)/(W+Ta+2Mo). The ratio of the formula represents the ratio of the amount of chromium and aluminium which have a positive effect particularly on corrosion resistance under the simulated combustion test and the amount of tungsten, tantalum and molybdenum which have a negative effect particularly thereon. The coefficient of each element indicates when weight % is converted to atom %. As shown in the chart, corrosion resistance under the simulated combustion test improves as the above-mentioned ratio increases, and not less than 3.0 is good. However, too high a ratio reduces the strength and not more than 4.5 is preferable.

Figure 2:
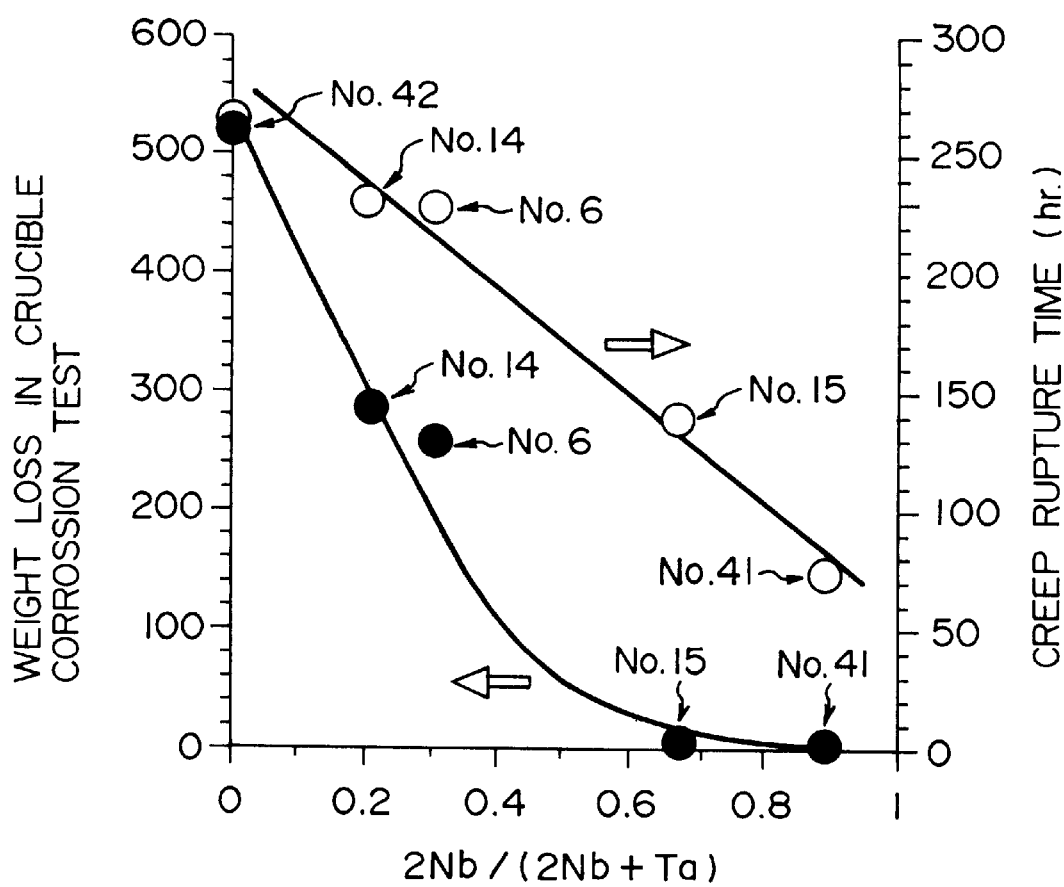
FIG. 2 is a chart showing the effect of a ratio of 2Nb/(2Nb+Ta) on corrosion resistance and creep rupture strength.

FIG. 2 is a chart showing the effect of a ratio of 2 Nb/(Nb+Ta) on corrosion resistance and creep rupture strength. The comparative alloy No. 42 including rhenium but no niobium has low corrosion resistance. Nevertheless, corrosion resistance is remarkably improved as the amount of niobium which is replaced by tantalum increases (the above-mentioned ratio increases). However, an excessive amount of niobium replaced by tantalum reduces creep rupture strength and the targeted strength cannot be obtained. Thus, the above-mentioned ratio is preferably between 0.2–0.8. The coefficient of each element indicates when weight % is converted to atom % as described above.

Figure 3:
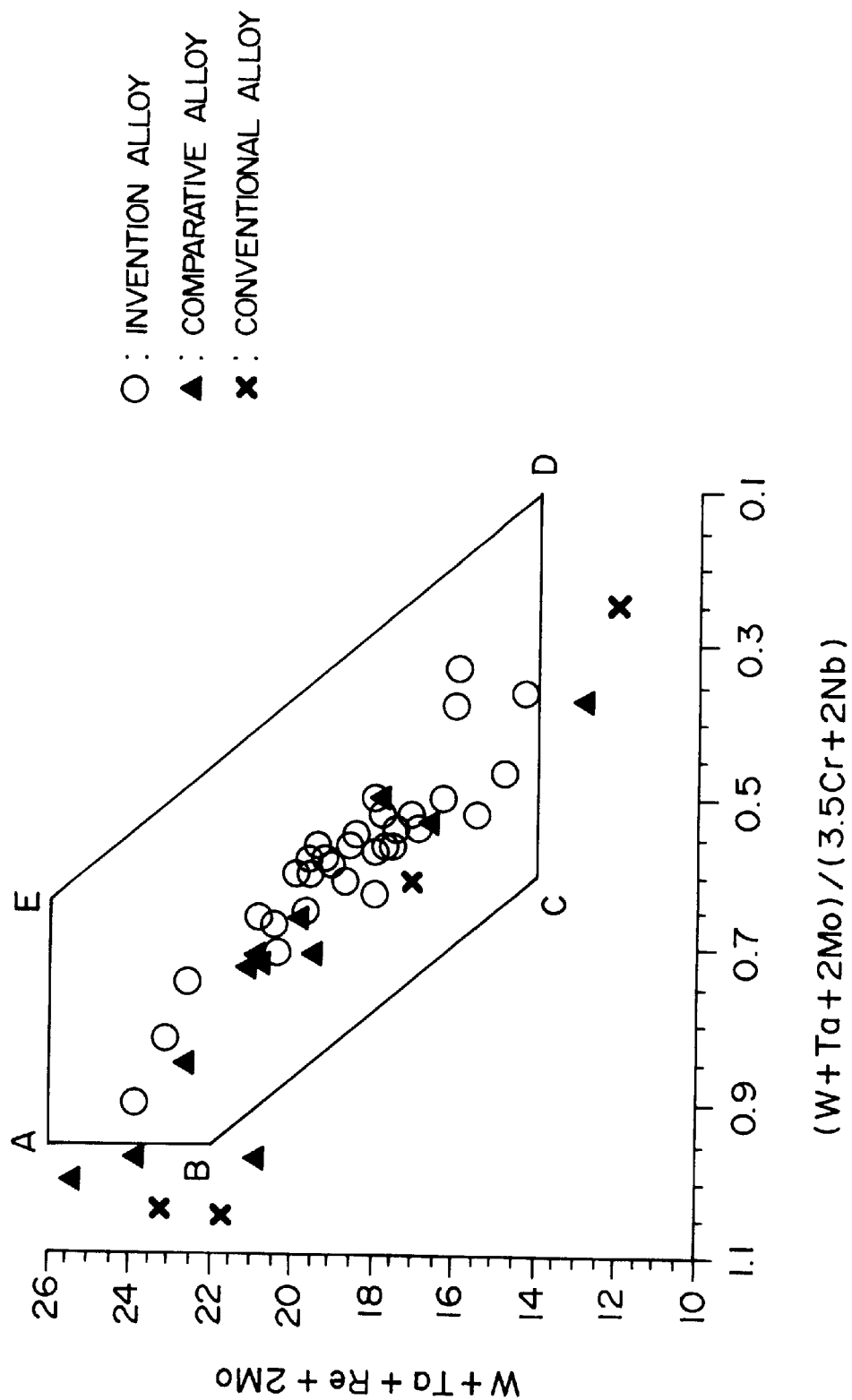
FIG. 3 is a chart showing the relationship between (W+Ta+Re+2Mo) and a ratio of (W+Ta+2Mo)/(3.5Cr+2Nb)

FIG. 3 shows that alloys of the present invention are preferably in a region surrounded by points (A)–(E) and that all the values of (W+Ta+Re+2Mo) of the alloys according to the present invention are not less than 14.0 and all the values of (W+Ta+2Mo)/(3.5Cr+2Nb) thereof are not more than 0.95. Although all the comparative alloys are within the region of the present invention as stated above, the amounts of the individual elements are out of the suitable regions according to the present invention. Moreover, according to Table 1, all the "P" value of the alloys of the present invention are below 3360. In FIG. 3, the points of the alloys according to the present invention on the vertical axis and the horizontal axis are particularly preferable on A (26.0, 0.95), B (22.0, 0.95), C (14.0, 0.6), D (14.0, 0.1) and E (26.0, 0.6).

Table 2 shows that all the alloys of the present invention No. 1–32, possess good properties such as corrosion resistance, oxidation resistance, good creep rupture life, creep rupture elongation and structural stability. In particular, the corrosion resistance is equivalent to that of Rene 80. The oxidation resistance is far better than that of Rene 80.

EXAMPLE 2

Figure 4:
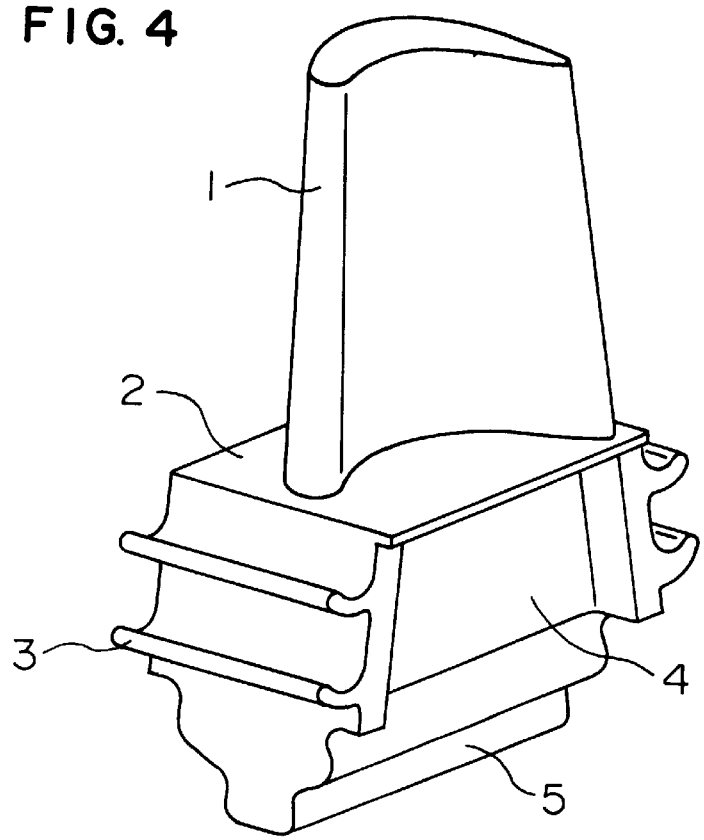
FIG. 4 is a perspective view of a gas turbine blade according to the present invention.
Figure 5:
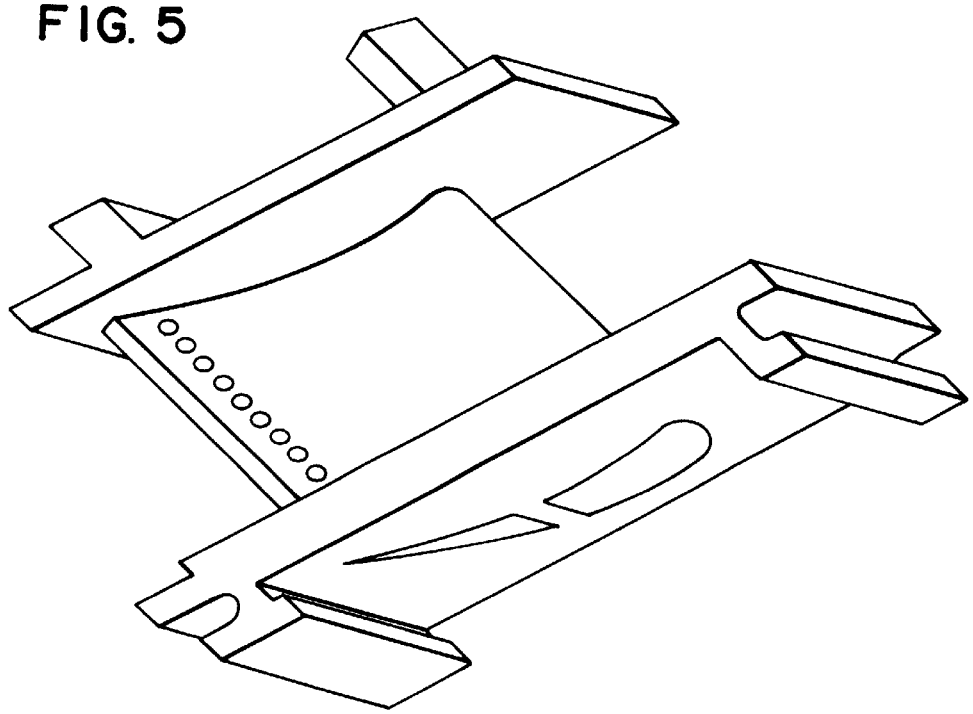
FIG. 5 is a perspective view of a gas turbine nozzle with a vane according to the present invention.

A gas turbine blade as shown in FIG. 4 and a gas turbine nozzle as shown in FIG. 5 were produced by employing the alloy of the present invention, No. 8 in Example 1.

Figure 6:
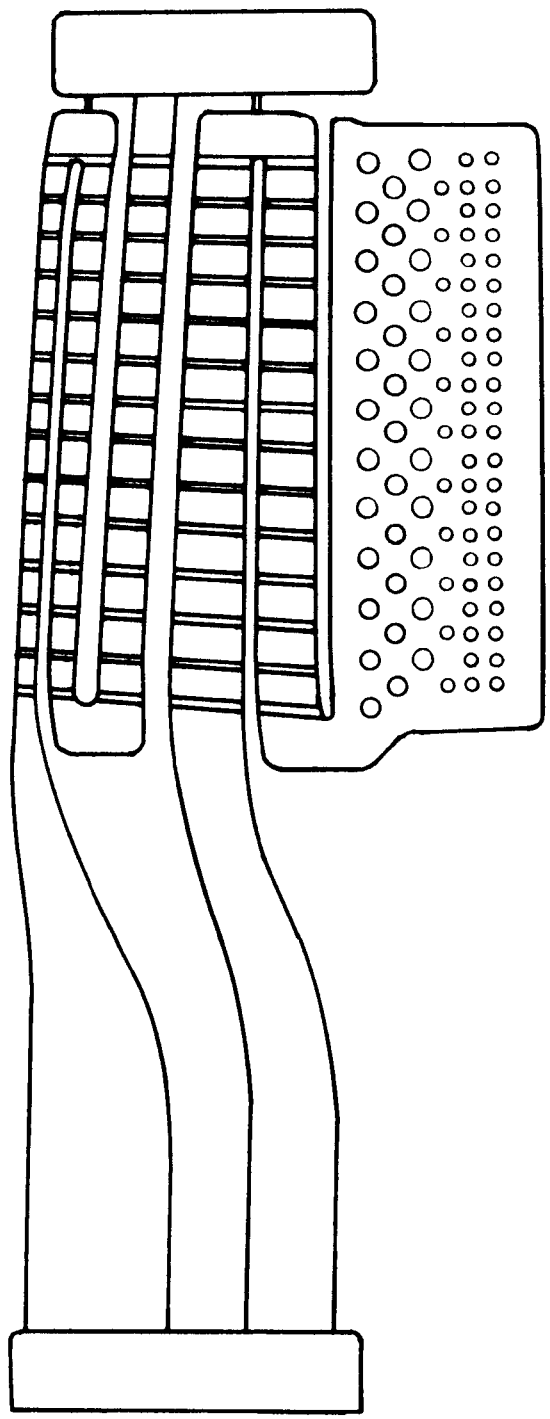
FIG. 6 is a front view of a core used for producing a gas turbine blade according to the present invention.
Figure 7:
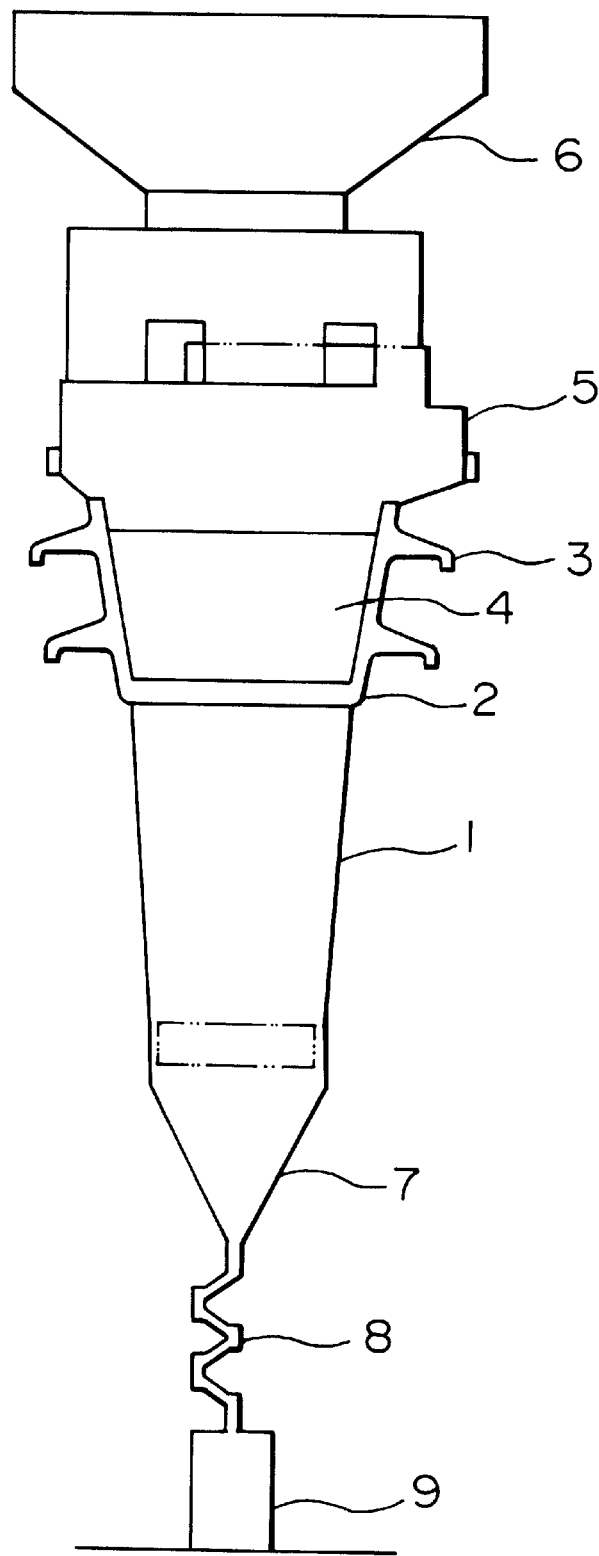
FIG. 7 is a front elevation of a wax model used for producing a gas turbine blade according to the present invention.

First, a wax model was produced around a core formed of refractory materials mainly composed of silica. A ceramics shell composed of refractory materials, such as alumina, zircon and yttria, was further formed around the wax model followed by dewaxing and firing. Thus, a mold was produced. FIG. 6 is a core for a gas turbine blade and used for providing a hollow structure for a cooling hole. FIG. 7 is a wax model for a gas turbine blade.

Then, in the vacuum withdrawal-type directionally solidifying furnace, a molten metal having the composition of the alloy of the present invention, No. 8 was poured in the above-mentioned mold and unidirectionally solidified sequentially from a starter portion at a lowering speed 30 cm/h so as to form a single crystal casting by utilizing a selector.

Subsequently, the core was removed by alkali and the starter portion, the selector, an enlarged portion and a riser portion and the like were cut. Thus, the shape of the gas turbine blade as shown in FIG. 4 and the shape of the gas turbine nozzle as shown in FIG. 5 were obtained. The whole length of the blade was 220 mm.

EXAMPLE 3

Figure 8:
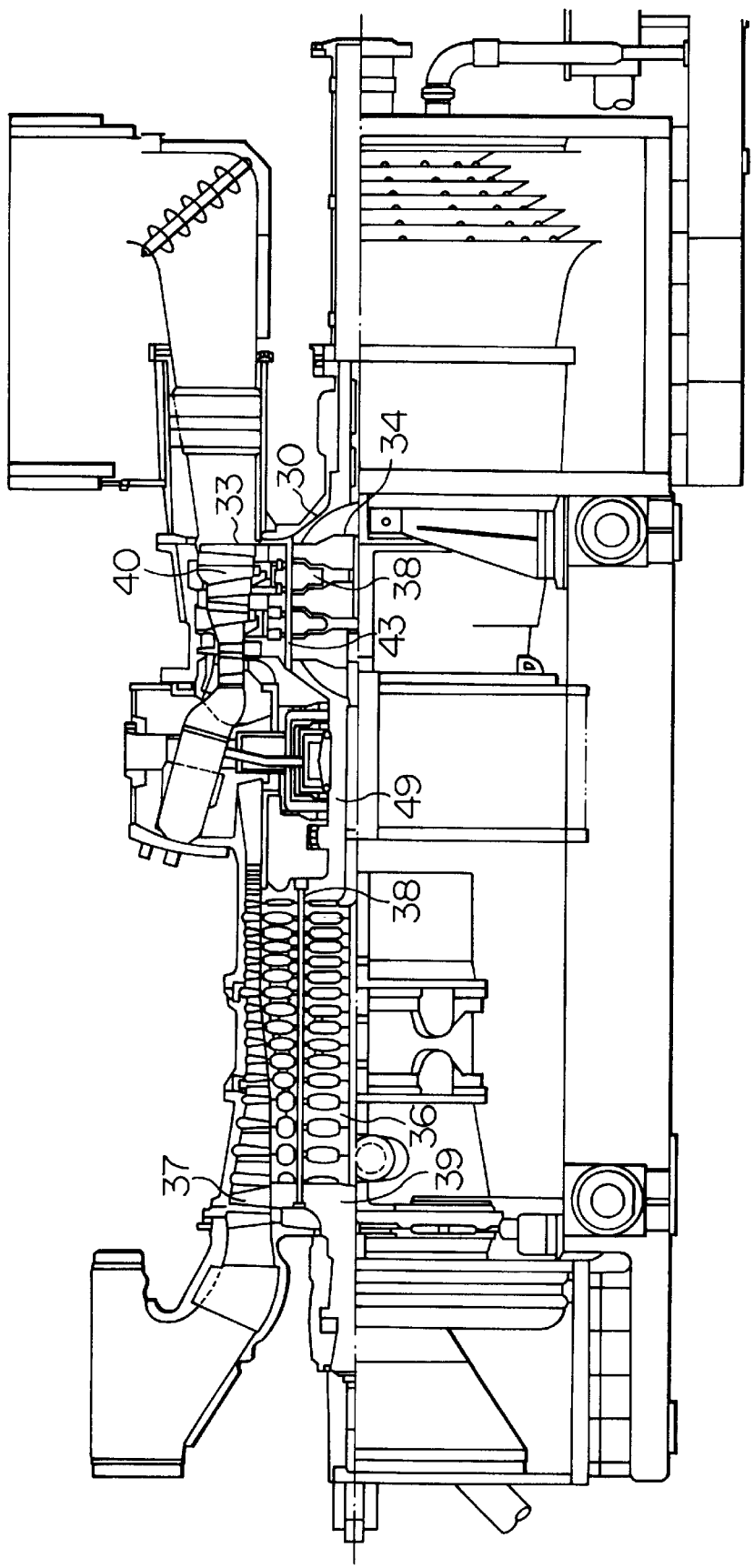
FIG. 8 is a sectional view of a rotary portion of a gas turbine.

FIG. 8 is a sectional view of a rotary portion of a gas turbine which has blades and nozzles of the gas turbine according to the present invention in Embodiment 2.

The rotary portion of the gas turbine includes a turbine stub shaft 30, a turbine moving blade 33, a turbine stacking bolt 43, a turbine spacer 38, a distant piece 49, a nozzle 40, a compressor disk 36, a compressor blade 37, a compressor stacking bolt 38, a compressor stub shaft 39 and a turbine disk 34. The gas turbine of the present invention has seventeen stages of the compressor disk 36 and three stages of the turbine blade, or the turbine blade may have four stages. An alloy of the present invention can be applied to turbine moving blades having either three or four stages.

The main types of the gas turbine in this embodiment are a heavy duty type, a single shaft type, a horizontal division casing type and a stacking type rotor. The compressor has a seventeen-stage axial flow type; the turbine has a three-stage impulse type and moving and stator blades by one or two stage air cooling; and the combustor has a reverse flow type, ten tubular combustor portions and a slot cool type.

The entire tempered martensitic steel, consisting essentially of, by weight, 0.06–0.15% carbon, not more than 1% silicon, not more than 1.5% manganese, 9.5–12.5% chromium, 1.5–2.5% nickel, 1.5–3.0% molybdenum, 0.1–0.3% vanadium, 0.03–0.15% niobium, 0.04–0.15% nitrogen and the balance being iron, is used for the distant piece 49, the turbine disk 34, the spacer 38 and the stacking bolt 33. The rotary portion of the gas turbine in this embodiment has characteristics of 90–120 kg/mm$^2$ of tensile strength, 70–90 kg/mm$^2$ of 0.2% yield strength, 10–25% of the elongation rate, 50–70% of area reduction, 5–9.5 kgm/cm$^2$ of the V-notch impact value, 45–55 kg/mm$^2$ of creep rupture strength at a temperature of 450° C. for 10$^5$ hours.

The turbine moving blade 33 has three stages and an alloy produced in Embodiment 1 was used for a first stage. The compressor had a compressor pressure of 14.7 and a temperature of substantially 400° C.; the gas turbine had a temperature of substantially 1350° C. at the inlet of the first blade; and the combustion gas temperature was substantially 1500° C. An alloy having the composition of Rene 80, consisting essentially of, by weight, 14% chromium, 9.5% cobalt, 4% molybdenum, 4% tungsten, 3% aluminium, 5% titanium, 0.17% carbon, 0.015% boron, 0.03% zirconium and the balance being nickel, and having a polycrystal structure was used for a second stage of the turbine blade 33 which stage has a length of 280 mm (160 mm of a blade portion and the remaining 120 mm from a platform portion), and an alloy having the composition of IN738, consisting essentially of, by weight, 0.17% carbon, 16% chromium, 8.5% cobalt, 1.75% molybdenum, 2.6% tungsten, 0.9% niobium, 3.4% titanium, 3.4% aluminium, 1.75% tantalum, 0.01% boron, and the balance being nickel, and having a polycrystal structure was used for a third stage of the turbine blade 33 which stage has the length of 350 mm (230 mm of a blade portion and the remaining 120 mm). Thus, a solid blade was produced by employing a precision casting method by the conventional lost wax process.

A single crystal casting obtained in Embodiment 2 was used for a first stage of the turbine nozzle 10 and a conventional cobalt-base alloy was used for a second stage and a third stage. The turbine nozzles having a vane were produced by forming the second stage and the third stage by employing the conventional vacuum precision casting method. The length of the vane is equivalent to that of the blade, and the vane comprises a structure of pin fin cooling, impingement cooling and film cooling. A first nozzle is exchangeably retained at side walls; and second stage nozzles and third stage nozzles are exchangeably retained at one of the side walls. An inter cooler is provided for the gas turbine.

60 MW of the power generation output and 33% or greater of the high heat efficiency can be obtained by this embodiment.

EXAMPLE 4

Figure 9:
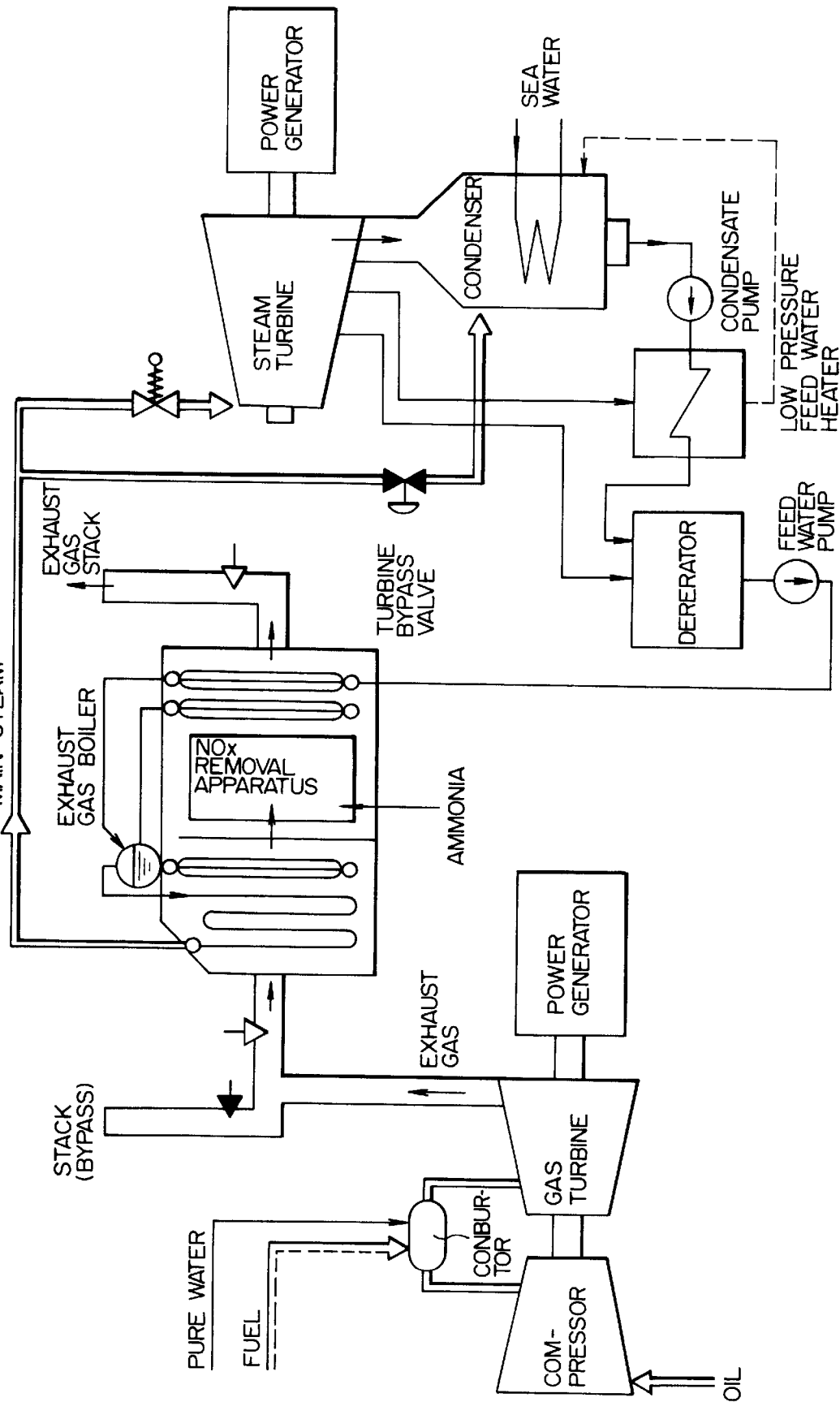
FIG. 9 is a schematic view showing a single shaft-type combined cycle power generation system.

FIG. 9 is a schematic view showing a single shaft-type combined cycle power generation system achieved by employing the gas turbine of Embodiment 4, together with a steam turbine.

A gas turbine uses the gas turbine blades and the gas turbine nozzles in Example 2 as first stage blades and first stage nozzles, respectively, together with a steam turbine so as to construct a single shaft combined cycle power generation system.

When power generation is performed by employing a gas turbine, it is likely that a combined cycle power generation method is adopted these days. Such a method is employed whereby energy from the exhaust gas of the gas turbine is recovered, and a steam turbine is driven by a high temperature steam obtained by such energy, and finally a power generator is driven by the steam turbine and the gas turbine. The use of the combined cycle power generation improves heat efficiency remarkably compared to the individual use of the gas turbine and the steam turbine, and the gas turbine of the present invention can obtain 50% or higher heat efficiency of the whole system.

The present system is operated as follows. First, air is introduced to an air compressor of the gas turbine through an air filter and an air silencer, and is compressed in the air compressor. Then, it is fed to a combustion in which fuel is injected into the compressed air and burned so as to generate a high temperature gas at a temperature of 1500° C. or more. The high temperature gas does work and the power is generated.

Subsequently, the gas at a temperature of 500° C. or more exhausted from the turbine is fed to the exhaust heat recovery boiler through an exhaust gas silencer and the thermal energy in the exhaust gas of the gas turbine is recovered, thereby generating high pressure steam at a temperature of 500° C. or more. The high pressure and low pressure steam which is generated is fed to the steam turbine.

Furthermore, the stream coming from the steam turbine is introduced into a condenser and deaerated so as to be transformed into condensed water. The condensed water has the pressure raised by a condensate pump and is fed to a boiler as feed water.

As a result, the gas turbine and the steam turbine drive a generator directly connected thereto from both ends of the shaft.

According to the present system, the power generation has been performed at approximately 52% of heat efficiency which is greater than that of a conventional thermoelectric power plant. Moreover, in a power generation system in which a plurality of combined cycle power generation systems are integrated into one plant, even in the case where the power generation is performed at a partial loading, by reducing the number of machines, it is possible to operate the machines in motion at substantially a rated loading which has higher heat efficiency, thus maintaining high heat efficiency throughout the whole plant.

According to the combined power generation system, a total of 90,000 KW power generation output composed of 60,000 KW from the gas turbine and 30,000 KW from the steam turbine can be obtained. Since the steam turbine of this embodiment is compact, it can be produced more economically than a large-scale steam turbine with the same amount of the power generation capacity, and thus it has a big advantage of being operated economically in terms of the shift of the amount of the power generation.

The steam turbine according to the present invention is a high-and-low pressure integrated type. The single-machine output of the turbine can be increased by raising the steam pressure at the inlet of the main steam of the high-and-low pressure integrated type steam turbine to 100 atg and by raising the temperature to 538° C. It is necessary to increase the length of the final stage of the moving blade by thirty inches or more and to increase the amount of the steam flow in order to raise the single-machine output.

The steam turbine according to the present invention includes thirteen stages or more of the blades firmly connected on high-and-low pressure integrated type rotor shafts. The steam flows in at a temperature of 538° C. at a pressure of 88 atg as stated above from the steam inlet via a steam control valve. The steam flows unidirectionally from the inlet to the final stage blade at a temperature of 33° C. at 722 mmHg and is exhausted from the outlet. Forged steel formed of low-alloy steel which essentially consists of niobium-chromium-molybdenum-vanadium is used for the high-and-low pressure integrated type rotor shaft of the present invention. The portion where the blades are firmly connected on a rotor shaft is disk-shaped and produced totally by cutting from the rotor shaft. The shorter the length of the blade, the longer the width of the disk portion is arranged so as to cause the least vibration.

The high-and-low pressure integrated type rotor shaft of this embodiment essentially consists of, by weight, 0.18–0.30% carbon, not more than 0.1% silicon, not more than 0.3% manganese, 1.0–2.0% nickel, 1.0–1.7% chromium, 1.0–2.0% molybdenum, 0.20–0.3% vanadium, and the balance being iron. It is quenched by water injection cooling at a temperature of 900–1050° C. and then tempered at a temperature of 650–680° C.

The construction of the plant can be arranged as a single-shaft type which combines six sets, one set comprising a gas turbine, an exhaust heat recovery boiler, a steam turbine and a power generator. Or the construction of the plant may be arranged as a multi-shaft type as follows. A power generator combined into a gas turbine makes one set, and six sets thereof are combined. Subsequently, the steam is obtained from the exhausted gas and then is introduced into a steam turbine and a power generator.

The complex power generation comprises a gas turbine which easily starts and stops for a short time and a steam turbine which is small-sized and simple, and thus the output can be easily adjusted. Therefore, the complex power generation is suitably used as an intermediate-load thermal power generator which responds to the changing demand.

The reliability of the gas turbine is remarkably enhanced due to the development of the latest technology and the system of the complex power generation plant comprises combinations of machines with small capacities. Thus, when a machine fault occurs, the damage thereof can be contained to local parts, thereby enhancing reliability.

As stated above, an alloy of the present invention has far better hot corrosion resistance than conventional single crystal alloys, good oxidation resistance which is comparable to one of the conventional single crystal alloys having the best oxidation resistance, and creep rupture strength which is equivalent or closer to that of the conventional single crystal alloys having higher strength than that of the other conventional single crystal alloys. As a result, an alloy of the present invention can be used as a single crystal casting, which is not conventionally easily adopted to a blade or a nozzle or the like of a high efficiency gas turbine for land-base use. Thus, by utilizing such a single crystal casting, operation in harsh hot corrosion environments and under the high creep stress becomes possible, and a high efficiency combined cycle power generation system having 50% or greater heat efficiency which is more than that of conventional systems can be obtained.

What is claimed is:

1. A highly hot corrosion resistant and high-strength superalloy, consisting essentially of, by weight, about 7.5% chromium, about 5.0% aluminum, about 7.2% tungsten, about 8.8% tantalum, about 0.8% molybdenum, about 0.8 cobalt, about 1.7% niobium, about 1.4% rhenium, about 0.1% hafnium, and about the balance being nickel and unavoidable impurities, wherein the superalloy has a single crystal structure of a base phase of $\gamma$ in which $\gamma'$-phase is precipitated, wherein creep rupture time at a temperature of 1040° C. at 19 kgf/mm$^2$ is not less than 100 hours, wherein a mass loss by corrosion under a total immersion in an atmosphere of 75%, by weight, sodium sulfate and 25%, by weight, sodium chloride at a temperature of 940° C. for 50 hours is not more than 300 mg/cm$^2$, and wherein an oxidation weight loss is not more than 19.6 mg/cm$^2$ after repeating a thermal cycle ten times by heating for 16 hours at 1100° C., followed by air cooling.

2. A highly corrosion resistant and high-strength single crystal casting produced by unidirectionally solidifying an alloy as defined in claim 1 and said casting having substantially no grain boundary.

3. A gas turbine blade formed of a highly hot corrosion resistant and high-strength single crystal casting as defined in claim 2.

4. A gas turbine blade as defined in claim 3, further comprising a wing against which the high temperature gas strikes; a platform portion and a sealfin which seal the high temperature gas; a shank portion which supports both portions; and a dovetail portion which is firmly connected on a disk.

5. A gas turbine blade as defined in claim 4, wherein the whole length of said gas turbine blade is not less than 150 mm longitudinally.

6. A gas turbine nozzle formed of a highly hot corrosion resistant and high-strength single crystal casting as defined in claim 2.

7. A gas turbine nozzle as defined in claim 6, further comprising a vane and side walls formed on both ends of said vane, and wherein said vane has a width of not less than 70 mm between said side walls on both ends of said vane and a length of not less than 100 mm from the inlet to the outlet into and out of which the combustion gas flows.

8. A gas turbine for revolving gas turbine blades by burning air compressed in a compressor and striking the high temperature gas through gas turbine nozzles against any said gas turbine blades as defined in claim 5 each firmly connected on a plurality of disks.

9. A gas turbine for revolving gas turbine blades by burning air compressed in a compressor and blowing the high temperature gas through said gas turbine nozzles as defined in claim 6 against said gas turbine blades each firmly connected on a plurality of disks.

10. A gas turbine for revolving gas turbine blades by burning air compressed in a compressor and blowing the high temperature gas through said gas turbine nozzles as defined in claim 7 against said gas turbine blades each firmly connected on a plurality of disks.

11. A combined cycle complex power generation system having a gas turbine driven by a high temperature gas which flows at a high speed, an exhaust heat recovery boiler obtaining steam from the energy of the gas exhausted by said gas turbine, a steam turbine driven by said steam, and a power generator driven by said gas turbine and said steam turbine, comprising 50% or greater of the heat efficiency of a whole plant, said system employing a gas turbine as defined in claim 10.

* * * * *